United States Patent
Lee et al.

(10) Patent No.: US 6,461,969 B1
(45) Date of Patent: Oct. 8, 2002

(54) MULTIPLE-STEP PLASMA ETCHING PROCESS FOR SILICON NITRIDE

(75) Inventors: Pei Ching Lee, Singapore (SG); Wen Jun Liu, Singapore (SG); Mei Sheng Zhou, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/442,314

(22) Filed: Nov. 22, 1999

(51) Int. Cl.[7] ............... H01L 21/302; H01L 21/3065; C09K 13/00
(52) U.S. Cl. ............... 438/706; 438/723; 438/724; 252/79.1
(58) Field of Search ................ 438/706, 723, 438/724; 252/79.1

(56) References Cited

U.S. PATENT DOCUMENTS

| | | | | |
|---|---|---|---|---|
| 4,816,115 A | * | 3/1989 | Horner et al. | 438/623 |
| 5,013,398 A | | 5/1991 | Long et al. | 156/643 |
| 5,354,417 A | | 10/1994 | Cheung et al. | 156/643 |
| 5,644,153 A | * | 7/1997 | Keller | 257/324 |
| 5,854,136 A | | 12/1998 | Huang et al. | 438/714 |
| 5,877,090 A | | 3/1999 | Padmapani et al. | 438/714 |
| 6,121,154 A | * | 9/2000 | Haselden et al. | 438/424 |

OTHER PUBLICATIONS

Jimenez, A. J., Recessed Oxide Isolation Having a Planar Surface, IBM Technical Disclosure Bulletin, vol. 26, No. 9, pp 4787 and 4788, Feb. 1984.*

* cited by examiner

Primary Examiner—Benjamin L. Utech
Assistant Examiner—Lynette T. Umez-Eronini
(74) Attorney, Agent, or Firm—George O. Saile; Rosemary L. S. Pike; Stephen G. Stanton

(57) ABSTRACT

A method for dry plasma selective etching of a pattern in a silicon nitride dielectric layer formed over a semiconductor substrate employed within a microelectronics fabrication. There is provided a semiconductor substrate having formed thereupon a pad oxide layer over which is formed a silicon nitride dielectric layer. There is formed over the substrate a patterned photoresist etch mask layer. There is then selectively etched the pattern of the photoresist etch mask layer into the silicon nitride layer employing a four-step etching process with three plasma etching environments which include; (1) a "break-through" etching step; (2) a "bulk" etching step to remove a majority of the silicon nitride layer and a "buffer" etching step to remove the remainder of the silicon nitride layer; and (3) an "over-etch" step to complete removal of silicon nitride without excessive etching of underlying material. These steps comprise the selective etching of the patterned silicon nitride layer while maintaining control of critical dimensions, with attenuated microloading and over-etching of underlying material.

12 Claims, 2 Drawing Sheets

MULTIPLE-STEP PLASMA ETCHING PROCESS FOR SILICON NITRIDE

BACKGROUND OF THE INVENTION

1. Field of the Invention

The invention relates to the field of manufacture of microelectronics fabrications. More particularly, the invention relates to the field of etching of microelectronics layers employed within microelectronics fabrications.

2. Description of the Related Art

Microelectronics fabrications are manufactured employing layers of microelectronics materials formed sequentially on substrates. Microelectronics conductor layers, often patterned into lines and shapes, are insulated from each other and other conductor regions by microelectronics dielectric layers. In the fabrication of particular geometries of microelectronics materials, it is necessary to form patterns from layers of such materials. This is commonly done employing subtractive etching of the microelectronics material layer through patterned etch mask resist layers formed upon the microelectronics layer. In other cases, the patterned mask layer acts as a barrier layer to avoid a particular reaction of a layer.

Among the microelectronics materials employed in microelectronics fabrication, silicon nitride is widely used both for its dielectric properties and for its etch resistant properties. In order to etch patterns in silicon nitride layers conveniently, it is common practice to employ dry etch methods involving plasma activation of reactive ions. In order to obtain high resolution patterned layers of silicon nitride with variable spacing and maintain control over the profiles of high aspect ratio pattern features, the etching processes often employ multiple process steps and materials for optimum performance. The selectivity of the etching of silicon nitride layers compared to other materials is important, since silicon nitride layers are often formed over other materials, in which case it is often necessary to assure the etching of the silicon nitride layer completely while keeping the underlying layer essentially unaffected and intact.

There is a need for selectively etching of a patterned silicon nitride layer to maintain critical dimensional control of the silicon nitride layer pattern under conditions of variable microloading of the substrate being etched while avoiding significant damage to underlying material layers. While satisfactory methods for plasma etching of silicon nitride layers in general are available, such methods are not without difficulties. For example, the etching of a high aspect ratio feature within a silicon nitride layer may result in trench formation through the silicon nitride at the foot of the feature while the region away from the foot may still contain unetched silicon nitride material. In addition, the selectivity of the silicon nitride etch rate ratio may not be very high compared to other adjacent or underlying materials.

Various methods have been disclosed for etching patterns within silicon nitride dielectric layers formed upon other materials in dry plasma etch environments with various rate selectivity.

For example, Long, in U.S. Pat. No. 5,013,398, discloses a method for etching a sandwich structure of silicon oxide/silicon/silicon oxide dielectric layers in a single chamber. The method employs sulfur hexafluoride and trifluoromethane to etch silicon oxide, and hydrogen bromide to etch silicon. Silicon nitride may be used in place of silicon oxide.

Further, Cheung et al., in U.S. Pat. No. 5,354,417, disclose a method for selective etching of a molybdenum silicide layer through a resist mask. The method employs sulfur hexafluoride and hydrogen bromide gases, with oxygen preferably added to the gas mixture.

Still further, Huang et al., in U.S. Pat. No. 5,854,136, disclose a multi-step method for etching a layer of silicon nitride over a layer of silicon oxide. The three-step method employs a first anisotropic etching environment of $CHF_3$, $SF_6$ and He gases to etch the bulk of the silicon nitride layer, followed by a second step in which HBr replaces $CHF_3$ to etch the remainder of the silicon nitride and provide a small amount of over-etching. A third step employs addition of an oxidizing gas to the etching mixture to assure removal of residues.

Finally, Padmapani et al., in U.S. Pat. No. 5,877,090, disclose a method for etching a silicon nitride dielectric layer over a silicon oxide dielectric layer. A plasma sustaining gas that includes nitrogen is employed with hydrogen bromide and one or both of nitrogen trifluoride and sulfur hexafluoride.

Desirable in the art of microelectronics fabrication are additional methods for etching patterns with high aspect ratios in silicon nitride dielectric layers employing dry plasma etch methods with varying selectivity of etching rates.

It is towards these goals that the present invention is generally directed.

SUMMARY OF THE INVENTION

A first object of the present invention is to provide a method for dry plasma selective etching of a pattern in a silicon nitride dielectric layer formed over a substrate employed within a microelectronics fabrication.

A second object of the present invention is to provide a method in accord with the first object of the present invention, where there is selectively etched a pattern in a silicon nitride layer employing dry plasma environments with critical dimensional control and attenuated microloading and etching of underlying layers.

A third object of the present invention is to provide a method in accord with the first object of the present invention and the second object of the present invention, where the invention is readily commercially implemented.

In accord with the objects of the present invention, there is provided a method for selective dry plasma etching of patterns in silicon nitride dielectric layers. To practice the invention, there is provided a silicon substrate having formed thereupon a silicon oxide pad oxide layer over which is formed a silicon nitride dielectric layer. There is formed over the substrate a patterned photoresist etch mask layer. There is then selectively etched the pattern of the photoresist etch mask into the silicon nitride layer employing a four-step dry plasma etching process in three plasma etching environments which include: (1) a first "break-through" etching step to initiate pattern formation; (2) a second "bulk" etching step of the major portion of the silicon nitride layer and a third "buffer" etching step to complete the patterned silicon nitride layer; and (3) a fourth "over-etch" etching step to assure complete removal of silicon nitride without excessive etching of underlying layer. These steps comprise the selective etching of silicon nitride pattern with critical dimensional control whereby there is attenuated microloading effects and the excessive etching of underlying material.

The method of the present invention may be practiced on silicon nitride dielectric layers formed over silicon substrates employed within microelectronics fabrications including but not limited to integrated circuit microelectronics fabrications, charge coupled display microelectronics fabrications, solar cell microelectronics fabrications and optoelectronics display microelectronics fabrications.

The present invention employs materials and methods which are known in the art of microelectronics fabrication but in a novel order and sequence. Therefore the method of the present invention is readily commercially implemented.

BRIEF DESCRIPTION OF THE DRAWINGS

The objects, features and advantages of the present invention are understood within the context of the Description of the Preferred Embodiment as set forth below. The Description of the Preferred Embodiment is understood within the context of the accompanying drawings, which form a material part of this disclosure, wherein:

FIG. 1 to FIG. 6 illustrate the formation, upon a silicon semiconductor substrate employed within a microelectronics fabrication, of a patterned silicon nitride dielectric layer employing a dry plasma subtractive selective etching process with critical dimensional control whereby there is attenuated microloading effects and excessive etching of underlying material layers.

DESCRIPTION OF THE PREFERRED EMBODIMENT

The present invention provides a method for dry plasma subtractive etching of a pattern in a silicon nitride dielectric layer formed upon a silicon semiconductor substrate employed within a microelectronics fabrication.

Referring now to FIG. 1 to FIG. 6, there is shown a series of schematic cross-sectional diagrams illustrating the results of etching, within a silicon nitride dielectric layer upon a silicon semiconductor substrate employed within a microelectronics fabrication, a pattern employing a multi-step selective dry plasma etching, in accord with a general method of the present invention which is a preferred embodiment of the present invention.

Figure 1:
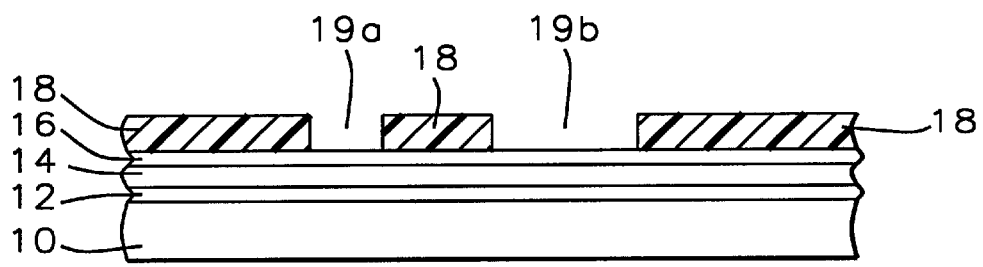
FIGS. 1, 2, 3, 4, 5 and 6 are directed towards a general embodiment of the present invention which constitutes a preferred embodiment of the present invention.

Shown in FIG. 1 is a silicon semiconductor substrate 10 upon which is formed a silicon oxide dielectric pad oxide layer 12. Formed over the pad oxide layer is a silicon nitride dielectric layer 14. Formed over the substrate is a patterned photoresist layer 18 and optional congruent antireflection coating layer 16. Pattern openings 19a and 19b represent narrow and wide patterned regions respectively.

With respect to the silicon semiconductor substrate 10 shown in FIG. 1, the silicon semiconductor substrate 10 may be the substrate itself employed within the microelectronics fabrication, or alternatively the substrate 10 may be any of several layers of silicon formed upon the substrate. Preferably the silicon semiconductor substrate is a single crystalline silicon wafer of (100) orientation with p-type doping to a resistivity of from about 0.5 to about 100 ohm-centimeter.

With respect to the silicon oxide pad oxide layer 12 shown in FIG. 1, the silicon oxide pad oxide layer 12 is formed by thermal oxidation of the silicon substrate 10. Preferably the pad oxide layer 12 is formed to a thickness of from about 100 to about 300 angstroms.

With respect to the silicon nitride dielectric layer 14 shown in FIG. 1, the silicon nitride dielectric layer 14 is formed by chemical vapor deposition employing the following process: (1) silane ($SiH_4$) silicon source gas at a flow rate of from about 150 to about 250 standard cubic centimeters per minute (sccm); (2) ammonia (NH3) nitrogen source gas at a flow rate of from about 500 to about 2000 standard cubic centimeters per minute (sccm); (3) nitrogen ($N_2$) carrier gas at a flow rate of about 500 to about 1000 standard cubic centimeters per minute (sccm); (4) temperature from about 700 to about 800 degrees centigrade; and (5) pressure form about 0.2 to about 0.8 torr. Preferably the silicon nitride layer is formed to a thickness of about 1000 to about 3000 angstroms.

With respect to the patterned photoresist etch mask 18 formed on the optional congruent patterned antireflection coating (ARC) 16, the photoresist etch mask layer 18 is formed employing methods and materials as are known in the field of microelectronics fabrication. The optional patterned congruent antireflection coating (ARC) 16 is formed employing organic polymer spin-on-polymer material. Preferably the anti-reflection coating (ARC) 16 is formed to a thickness of about 500 to about 800 angstroms.

Figure 2:
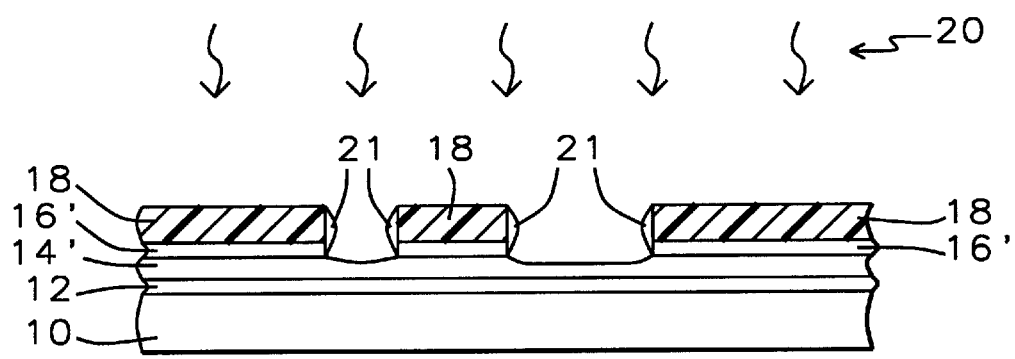

Referring now to FIG. 2, there is shown a schematic cross-sectional diagram illustrating the results of further processing of the microelectronics fabrication whose schematic cross-sectional diagram is shown in FIG. 1. FIG. 2 is a microelectronics fabrication otherwise equivalent to the microelectronics fabrication shown in FIG. 1, but where there has been exposed the microelectronics fabrication to a first plasma etching environment 20, resulting in the initial etching of the silicon nitride layer 14' through the pattern openings 19a and 19b and the simultaneous formation of polymer layers 21 on the sides of the pattern defining layers 18' and 16'.

With respect to the first plasma etching environment 20 shown in FIG. 2, the first plasma etching environment 20 employs chlorine ($Cl_2$) gas and the following process conditions: (1) pressure from about 100 to about 1000 mTorr; (2) power from about 100 to about 500 watts; (3) electrode gap from about 0.8 to about 1.8 centimeters; (4) chlorine ($Cl_2$) gas flow rate of from about 30 to about 300 standard cubic centimeters per minute (sccm); (5) helium gas flow rate of from 0 to about 500 standard cubic centimeters per minute (sccm), (6) helium thermal clamp gas pressure from about 2 to about 12 Torr; and (7) time from about 10 to about 60 seconds. The purpose of the first etching environment is to break through the surface of and begin etching of the silicon nitride layer, and the step is referred to as the "break-through" step.

Another aspect of the first plasma etching environment of $Cl_2$ for beginning the etching of silicon nitride layer 14' is the formation of a polymer reaction product which tends preferentially to deposit on the sidewall 21 of the photoresist etch mask layer and etched silicon nitride layer 14' as shown in FIG. 2. This sidewall deposit 21 serves to reduce lateral etching of patterned silicon nitride and is beneficial in maintaining linewidth control of critical dimensions in the etched patterned silicon nitride layer.

The present invention may be practiced in conventional plasma reactor equipment as are known in the art of reactive ion etching in microelectronics fabrication. Preferably the plasma reactor equipment employed to implement the present invention is the LAM 4428XL plasma reactor manufactured by Lam Research Corporation, 4650 Cushing Parkway, Fremont, Calif. 94538-6470, USA.

Figure 3:
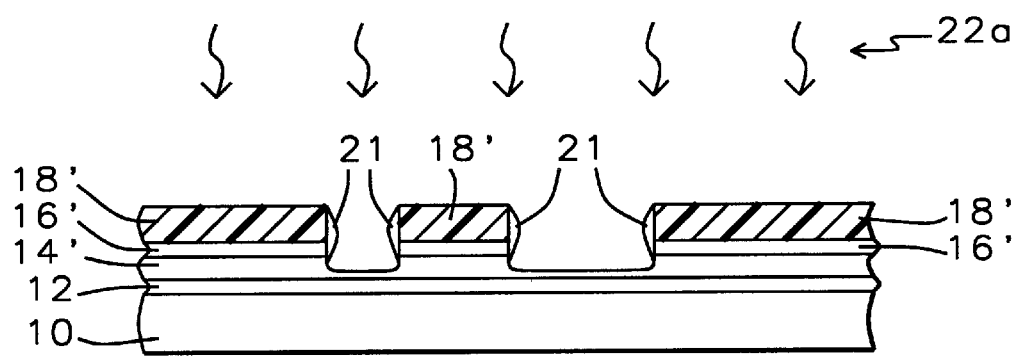

Referring now more particularly to FIG. 3, there is shown a schematic cross-sectional diagram illustrating the results of further processing of the microelectronics fabrication whose schematic cross-sectional diagram is shown in FIG. 2. Shown in FIG. 3 is a microelectronics fabrication otherwise equivalent to the microelectronics fabrication shown in FIG. 2, but where there has been exposed the substrate to a second plasma etching environment 22a, resulting in further etching of the pattern openings 19a and 19b into the silicon nitride layer 14' employing a "bulk" etching step to etch the major portion of the silicon nitride layer.

With respect to the second plasma etching environment 22a shown in FIG. 3, the second plasma etching environment 22a employs the following process conditions: (1) pressure from about 100 to about 1000 mTorr; (2) power from about 100 to about 500 watts; (3) electrode gap from about 0.8 to about 1.8 centimeter (cm); (4) sulfur hexafluoride ($SF_6$) gas flow rate of from about 20 to about 200 standard cubic centimeters per minute (sccm); (5) helium gas flow rate from 0 to about 500 standard cubic centimeters per minute (sccm); (6) helium gas clamp pressure from about 2 to about 10 Torr; (7) time from about 10 to about 60 seconds to remove about 80% of the silicon nitride layer; In the second etching environment, the "bulk" etching process for the removal of the silicon nitride layer 14' preferably removes about 80% of the silicon nitride layer 14'.

Figure 4:
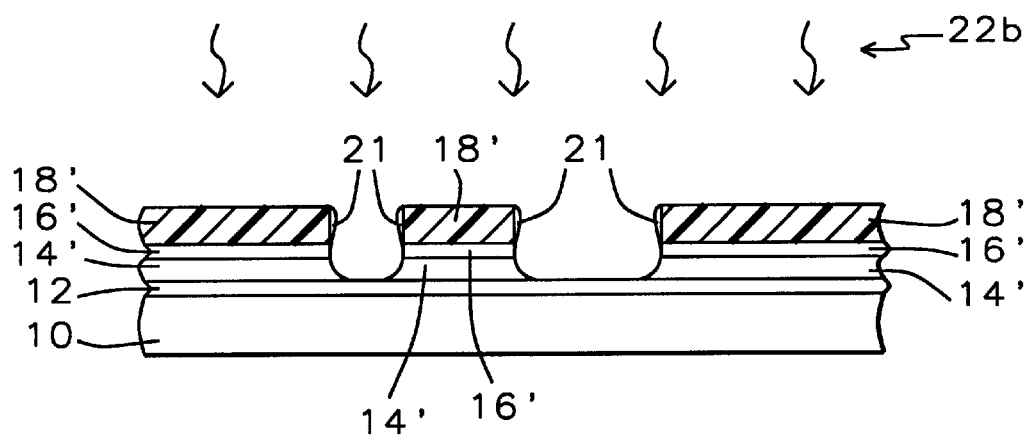

Referring now more particularly to FIG. 4, there is shown a schematic cross-sectional diagram illustrating the results of further processing of the microelectronics fabrication whose schematic cross-sectional diagram is shown in FIG. 3. Shown in FIG. 4 is a microelectronics fabrication otherwise equivalent to FIG. 3, but where there has been exposed the substrate to the plasma etching environment 22b to insure completion of the process of etching the pattern in the silicon nitride layer 14' to the pad oxide layer 12 by a "buffer" step which assures removal of the silicon nitride layer 14' in the openings 19a and 19b.

With respect to the third plasma etching environment 22b shown in FIG. 4, the third plasma etching environment 22b is formed analogous to the plasma environment 22a shown in FIG. 3 but employing the following conditions:(1) pressure of from about 300 to about 1000 Torr;(2) power from about 100 to about 3000 watts; (3) electrode gap from about 0.8 to about 1.8 centimeter (cm); (4) sulfur hexafluoride ($SF_6$) gas flow rate of from about 20 to about 200 standard cubic centimeters per minute (sccm); (5) hydrogen bromide (HBr) gas flow rate of from about 20 to about 100 standard cubic centimeters per minute (sccm); (7) oxygen gas flow rate of from zero to about 100 standard cubic centimeters per minute (sccm); (8) helium gas flow rate of from zero to about 500 standard cubic centimeters per minute (sccm); (9) helium thermal clamp gas pressure from about 2 to about 10 Torr; and (10) time from about 10 to about 60 seconds (sec). The third "buffer" step serves to remove the remaining amount of silicon nitride, preferably about 20%, and essentially completes the selective etching of the patterned silicon nitride layer.

Figure 5:
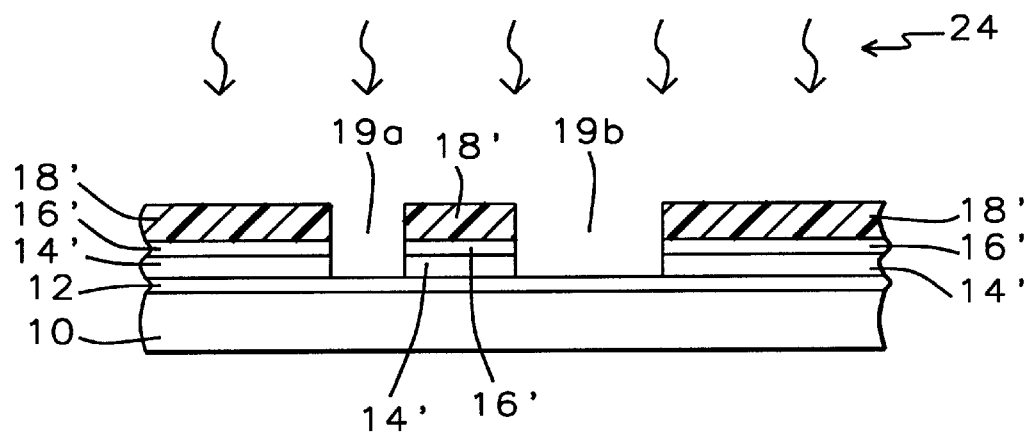

Referring now more particularly to FIG. 5, there is shown a schematic cross-sectional diagram illustrating the results obtained by further processing of the microelectronics fabrication whose schematic cross-sectional diagram is shown in FIG. 4 in accord with the present invention. Shown in FIG. 5 is a microelectronics fabrication otherwise equivalent to the microelectronics fabrication shown in FIG. 4, but where there has been exposed the substrate to a third plasma etching environment 24 to provide an fourth "over-etch" step to assure complete removal of all silicon nitride in the openings 19a and 19b without excessive etching of the underlying material layer, and removal of all sidewall residues 21.

With respect to the third plasma etching environment 24 shown in FIG. 5, the third plasma environment 24 employs the following process conditions: (1) pressure from about 100 to about 1000 torr; (2) power from about 100 to about 500 watts; (3) electrode gap from about 0.8 to about 1.8 centimeter (cm); (4) sulfur hexafluoride ($SF_6$) gas flow rate of from about 20 to about 200 standard cubic centimeters per minute (sccm); (5) hydrogen bromide (HBr) gas flow rate of from about 5 to about 50 standard cubic centimeters per minute (sccm).

Figure 6:
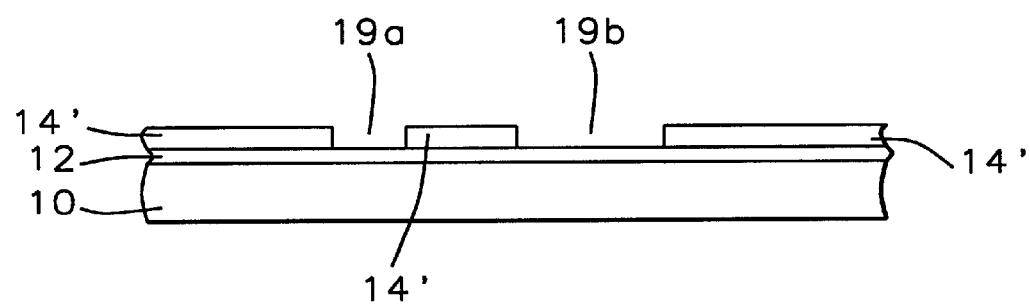

Referring now to FIG. 6, there is shown a schematic cross-sectional diagram illustrating the final results of further processing of the microelectronics fabrication whose schematic cross-sectional diagram is shown in FIG. 5. Shown in FIG. 6 is a microelectronics fabrication otherwise equivalent to the microelectronics fabrication shown in FIG. 5, but where there has been stripped the patterned photoresist etch mask layer 18' and optional congruent antireflection coating (ARC) layer 16' from the substrate. The pattern openings 19a and 19b are thus completely etched free of any silicon nitride down to the pad oxide layer 12, with critical dimensional control and attenuated microloading and etching of underlying layers.

The present invention provides a method for plasma etching a pattern within a silicon nitride layer formed upon a silicon substrate employed within a microelectronics fabrication wherein there is attenuated microloading and etching of underlayer material while maintaining control of critical dimensions. The provision of a first or "breakthrough" plasma etching step with chlorine gas serves to begin the subtractive etching process while simultaneously forming a polymeric layer on the sidewalls of the photoresist pattern. The polymeric coating is beneficial as it serves to minimize critical dimensional variations. The continuation of silicon nitride etching in the second plasma etching environment by means of the "bulk" step removes about 80% of the silicon nitride, and the completion of the silicon nitride etching by means of the "buffer" step removes the remaining 20% of the "buffer" step. Finally, a fourth etching step in a third plasma etching environment serves as an "over-etch" step to ensure removal of all silicon nitride without excessive etching of underlayer material.

EXAMPLE

The present invention provides a selectivity of etch rate and etch rate ratios for silicon nitride and silicon oxide which may be beneficially employed in etching patterns in silicon nitride layers formed over silicon oxide layers with control of critical dimensions and attenuated etching damage to underlying silicon oxide layers. Samples were prepared employing silicon substrates upon which were formed silicon nitride layers in accord with the following process conditions: (1) silicon substrates with p-type doping; (2) silicon oxide layers formed employing thermal oxidation of silicon substrates in oxygen at a pressure of from about 500 to about 760 torr at a temperature of from about 800 to about 1000 degrees centigrade; and (3) silicon nitride formed employing chemical vapor deposition (CVD) from: (a) silane and ammonia reactive gases at flow rates of from about 150 to about 350 and from about 500 to about 2000 standard cubic centimeters per minute (sccm) respectively; (b) nitrogen carrier gas at a flow rate of from about 500 to about 1000 standard cubic centimeters per minute (scm); (c) pressure of from about 0.2 to about 0.8 torr; and (d) temperature of from about 700 to about 800 degrees centigrade. The layer thickness was measured employing Opriprobe thickness measuring equipment. The silicon nitride layers were etched employing the three plasma etching environments as described in the present invention. The results are shown in Table I, which gives the observed data for the steps of the present invention:

TABLE I

Etch Rate and Etch Rate Ratio for silicon nitride and Silicon Oxide

| | Break-Through Step | Main (80%) Step | Buffer (20%) Step | Over-Etch Step |
|---|---|---|---|---|
| Nitride Etch rate, angstroms/minute | 500 | 4000 | 1200 | 500 |
| Etch rate ratio, Nitride:Oxide | — | 2:1 | 4:1 | 10:1 |

It can be seen that the present invention provides the desired high rate of silicon nitride etching rate for removal of the bulk of the silicon nitride, with the equally desired high discrimination of a high rate for removal of the last residues of silicon nitride without significant removal of underlying silicon oxide layer at completion of the process. Thus there is afforded the attenuation of over-etching of underlying silicon oxide as well as complete removal of silicon nitride residues at the end of the pattern etching process while maintaining control of critical dimensions of the patterned silicon nitride layer.

As is understood by a person skilled in the art, the preferred embodiment of the present invention is illustrative of the present invention rather than limiting of the present invention. Revisions and modifications may be made to materials, structures and dimensions through which is provided the preferred embodiment of the present invention while still providing embodiments which are within the spirit and scope of the present invention, as defined by the appended claims.

What is claimed is:

1. A method for etching a pattern within a silicon nitride layer formed upon a semiconductor substrate employed within a microelectronics fabrication comprising:

providing a semiconductor substrate having formed thereupon a silicon oxide pad oxide layer and a silicon nitride layer;

forming over the semiconductor substrate an optional antireflection coating layer and a patterned photoresist etch mask layer;

treating the semiconductor substrate to a first plasma etching environment to perform a first or break-through step of etching the pattern into the silicon nitride layer;

treating the semiconductor substrate to a second plasma etching environment to perform a second or bulk step of etching the pattern into the silicon nitride layer;

continuing to treat the semiconductor substrate to the second plasma etching environment to perform a third or buffer step of etching the pattern into the silicon nitride layer; and treating the semiconductor substrate to a third plasma etching environment to perform a fourth or over etch step of etching the pattern into the silicon nitride layer to complete etching of the patterned silicon nitride layer without etching the underlying pad oxide layer;

wherein the first, second and third plasma etching environments are each different from each other.

2. The method of claim 1 wherein the semiconductor substrate is a single crystal silicon substrate of (100) crystalline orientation.

3. The method of claim 1 wherein the semiconductor substrate is employed within a microelectronics fabrication selected from the group consisting of:

integrated circuit microelectronics fabrications;

solar cell microelectronics fabrications;

charge coupled display microelectronics fabrications; and optoelectronics display microelectronics fabrications.

4. The method of claim 1 wherein the silicon oxide pad oxide is formed by thermal oxidation of silicon to a silicon oxide thickness of about 100 to about 300 angstroms.

5. The method of claim 1 wherein the silicon nitride layer is formed by chemical vapor deposition (CVD) to a thickness of about 1000 to about 3000 angstroms.

6. The method of claim 1 wherein the optional antireflection coating layer is formed employing organic polymer spin-on-polymer (SOP) material.

7. The method of claim 1 wherein the first plasma etching environment comprises:

chlorine ($Cl_2$) gas;

helium gas;

power from about 100 to about 500 watts;

electrode gap from about 0.8 to about 1.8 centimeters; and etching time from about 10 to about 60 seconds.

8. The method of claim 7 wherein the first plasma etching environment accomplishes the "break-through" etching reaction of the silicon nitride layer surface and forms a polymer which deposits on the pattern sidewalls.

9. The method of claim 1 wherein the second plasma etching environment comprises:

sulfur hexafluoride ($SF_6$) gas;

helium gas;

power from about 100 to about 500 watts; and electrode gap from about 0.8 to about 1.8 centimeter.

10. The method of claim 9 wherein the second plasma etching environment is employed in steps consisting of:

a bulk etching step which removes about 80% of the silicon nitride layer; and a buffer etching step which removes about the remaining 20% of the silicon nitride layer.

11. The method of claim 1 wherein the third plasma etching environment comprises:

sulfur hexafluoride ($SF_6$) gas, hydrogen bromide (HBr) gas;

oxygen ($O_2$) gas;

helium gas;

power from about 100 to about 500 watts; and electrode gap from about 0.8 to about 1.8 centimeter.

12. The method of claim 11 wherein the third plasma etching environment serves as an over-etch step to complete the etching of the patterned silicon nitride layer without excessive etching of the underlying silicon oxide layer.

* * * * *